(12) United States Patent
Johnson et al.

(10) Patent No.: US 10,320,088 B1
(45) Date of Patent: Jun. 11, 2019

(54) BALANCED WIDEBAND IMPEDANCE TRANSFORMER

(71) Applicants: Alexander Johnson, Miami, FL (US); Elias Alwan, Miami, FL (US); John L. Volakis, Miami, FL (US)

(72) Inventors: Alexander Johnson, Miami, FL (US); Elias Alwan, Miami, FL (US); John L. Volakis, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 16/188,438

(22) Filed: Nov. 13, 2018

(51) Int. Cl.
*H01Q 1/48* (2006.01)
*H01Q 5/25* (2015.01)
*H01Q 9/16* (2006.01)
*H03H 7/42* (2006.01)
*H01Q 21/00* (2006.01)
*H01Q 21/06* (2006.01)

(52) U.S. Cl.
CPC .......... *H01Q 21/0075* (2013.01); *H01Q 1/48* (2013.01); *H01Q 5/25* (2015.01); *H01Q 9/16* (2013.01); *H01Q 21/062* (2013.01); *H03H 7/425* (2013.01)

(58) Field of Classification Search
CPC ........ H01Q 21/0075; H01Q 5/25; H01Q 1/48; H01Q 9/16; H01Q 21/062; H03H 7/425
USPC .......................................................... 333/128
See application file for complete search history.

(56) References Cited

U.S. PATENT DOCUMENTS

2013/0307742 A1* 11/2013 Hu .................. H01Q 1/243
343/821
2014/0097995 A1* 4/2014 McKinzie, III ...... H01Q 9/0407
343/793

* cited by examiner

*Primary Examiner* — Robert J Pascal
*Assistant Examiner* — Kimberly E Glenn
(74) *Attorney, Agent, or Firm* — Saliwanchik, Lloyd & Eisenschenk

(57) ABSTRACT

A balanced wideband impedance transformer can include a first conductor layer including a first metal line and a second metal line, a second conductor layer including a first feed line and disposed on the first conductor layer, a third conductor layer including a second feed line and disposed on the second conductor layer, and a fourth conductor layer including a third metal line and a fourth metal line, and disposed on the third conductor layer.

20 Claims, 14 Drawing Sheets

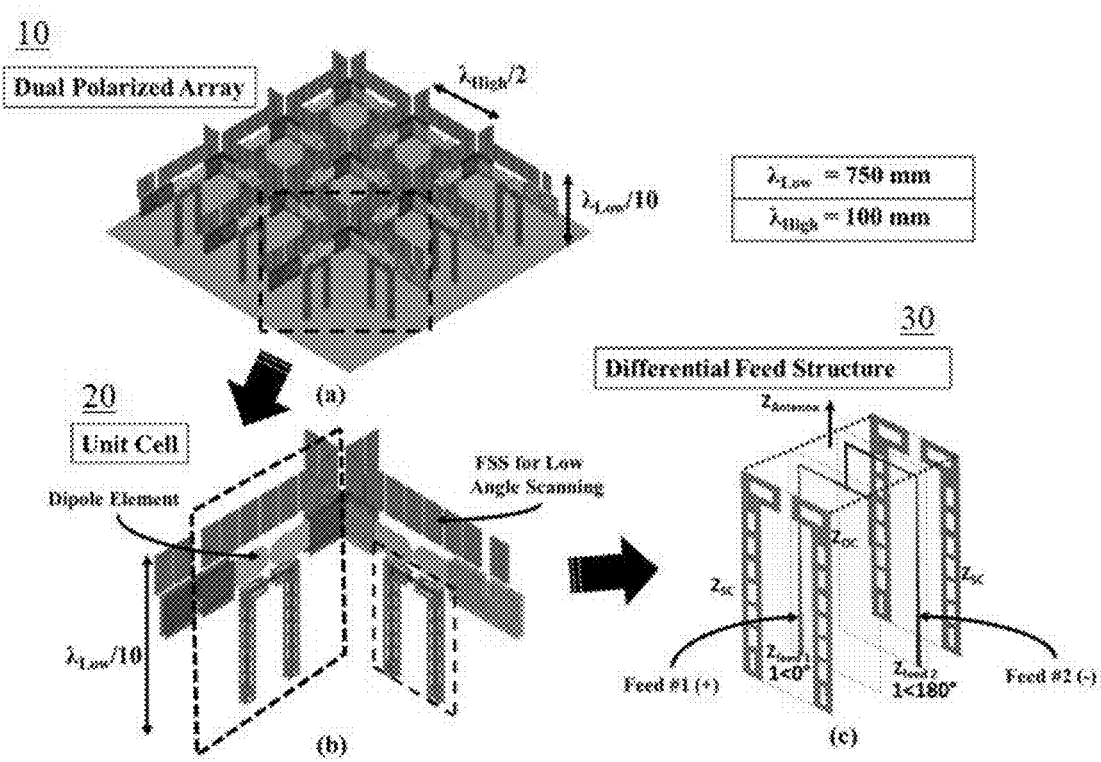
Figure 1(a)-(c)

BALANCED WIDEBAND IMPEDANCE TRANSFORMER

BACKGROUND

Low profile wideband antennas and arrays are essential for high data rate communications and software defined radios (SDRs). An ultra-wideband (UWB) array replaces several narrowband systems to reduce power, cost, and space requirements. They also enable increased spectral efficiency, Multiple-Input-Multiple-Output (MIMO), and simultaneous transmit and receive (STAR) capabilities. In addition to being wideband and low profile, such arrays must operate across a wide scanning range for comprehensive spatial coverage.

UWB phased array design is often hindered by the size-bandwidth-scanning triad. For example, Vivaldi or tapered slot arrays are known for their large operational bandwidth, viz. 10:1 impedance bandwidth, but are multiple wavelengths tall. Among low profile UWB arrays, the Tightly Coupled Dipole Antenna (TCDA) array has demonstrated large impedance bandwidths and scanning performance in a low profile of ($\lambda_{High}/2$). These UWB arrays are extensions of the Current Sheet Array (CSA) concept. The first CSAs achieved 4:1 bandwidth by introducing capacitive coupling between antenna elements to counter the effect of ground plane inductance. Additional bandwidth was later achieved by introducing integrated wideband printed balun feeds to be optimized along with the dipole elements. Such TCDA with integrated feeds have been demonstrated to extend bandwidths, reduce size by more than half, and cut weight by a factor of 5, all with an order of magnitude cost reduction. Further optimizations of the TCDA were addressed to increase impedance bandwidths up to 20:1 via substrate loading, scan down to 75° through Frequency Selective Surface (FSS) superstrates, and operate at millimeter-wave frequencies. As a result, TCDAs were designed from 300 MHz up to 90 GHz with VSWR <3.

All the above-mentioned designs employ wideband single-ended (unbalanced) feeds, but these feeds are not suited for the direct chip integration required for 5G applications. The latter is important as future integrated transceivers are likely to be differential to accompany the balanced transmission lines on the RF side of the chips. The major challenge in the design of a full differential radio is the reduction of the common mode currents that can exist at the aperture and in between the ports that feed the aperture. These common mode currents can greatly reduce the impedance bandwidth. Indeed, differential feeds have been proposed in the past, but they are narrowband with limited scanning capability. Therefore, most past arrays have employed only single-ended feeds to achieve wideband scanning. However, these single-ended feeds suffer from distortions introduced by noise from common-mode, power supplies, or general electromagnetic interference (EMI), drastically affecting antenna performance.

Differential Radio Frequency (RF) front-ends provide greater immunity to ground noise and distortion by suppressing external interference. Recent advancements in differential RF front-ends offer high dynamic range, high linearity, and low noise in the transceiver chain. However, a major bottleneck with differential systems is the presence of a common mode when operating across large bandwidths, particularly for wideband phased arrays.

BRIEF SUMMARY

Embodiments of the subject invention provide novel and advantageous balanced wideband impedance transformers (BWITs) that comprise a first feed line between a first metal line and a third metal line, and a second feed line between a second metal line and a fourth metal line, thereby eliminating common mode currents and reducing power, cost, and space.

In an embodiment, a balanced wideband impedance transformer can comprise: a first conductor layer including a first metal line and a second metal line; a second conductor layer including a first feed line and disposed on the first conductor layer; a third conductor layer including a second feed line and disposed on the second conductor layer; and a fourth conductor layer including a third metal line and a fourth metal line, and disposed on the third conductor layer.

In another embodiment, a balanced wideband impedance transformer can comprise: a first perforated metal line and a second perforated metal line that are disposed at a first plane; a third perforated metal line and a fourth perforated metal line that are disposed at a second plane; a first feed line disposed between the first perforated metal line and the third perforated metal line; and a second feed line disposed between the second perforated metal line and the fourth perforated metal line.

In yet another embodiment, a balanced wideband impedance transformer can comprise: a substrate; a first metal line and a second metal line that are disposed on a first surface of the substrate; a third metal line and a fourth metal line that are disposed on a second surface of the substrate; a first feed line disposed between the first metal line and the third metal line and disposed inside the substrate; a second feed line disposed between the second metal line and the fourth metal line and disposed inside the substrate; a first dipole connected to the first feed line and disposed inside the substrate; a second dipole connected to the second feed line and disposed inside the substrate; a plurality of frequency selective surface (FSS) superstrates disposed inside the substrate; and a ground plane connected to the first to fourth metal lines, the first dipole being placed between the first feed line and the FSS superstrates.

BRIEF DESCRIPTION OF DRAWINGS

FIG. 1(a) shows a dual polarized differential TCDA (D-TCDA) array according to an embodiment of the subject invention.

FIG. 1(b) shows a unit cell of dual offset D-TCDA design according to an embodiment of the subject invention.

FIG. 1(c) shows a differential feed structure according to an embodiment of the subject invention.

DETAILED DESCRIPTION

Figure 1D:
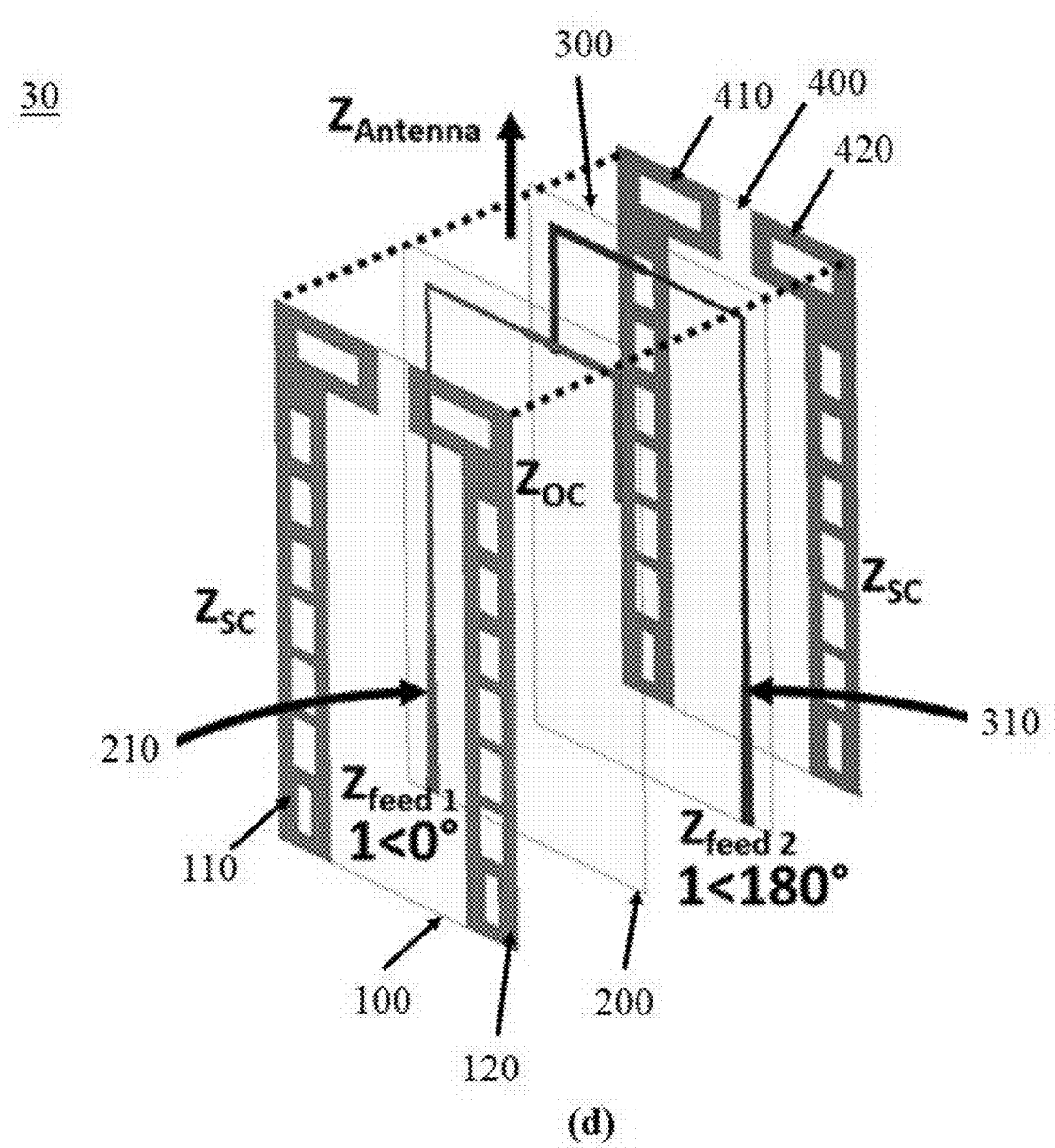
FIG. 1(d) shows an enlarged differential feed structure according to an embodiment of the subject invention.

Embodiments of the subject invention provide novel and advantageous balanced wideband impedance transformers (BWITs) that comprise a first feed line between a first metal line and a third metal line, and a second feed line between a second metal line and a fourth metal line, thereby eliminating common mode currents and reducing power, cost and space.

Embodiments of the subject invention include a differential feeding network operating across an ultra-wide bandwidth, viz. >8:1 bandwidth and also an impedance transformer for adaptability with commercial standards.

Embodiments of the subject invention provide many technical benefits: 1) the ultra-wide bandwidth enables multi-function operation, condensing the number of components needed for all these tasks, thereby reducing power, cost, and space by orders of magnitude; 2) differential feeds improve noise resilience, and improve a system's dynamic range; and 3) the embodiment is manufactured through inexpensive well-known techniques and compatible with off the shelf components.

The design according to embodiments of the subject invention can be manufactured with printed circuit board (PCB) technology for cheap/low cost mass production. The small form factor and compatibility with current and envisioned future technology make this technology ideal for commercial 5G applications.

This small volume, high performance design can be integrated with transceiver chips (system on chip or system in package), wideband systems, and future 5G technologies for applications in commercial and military communications, radar, and remote sensing.

Embodiments of the subject invention present a novel wideband differential feed for the UWB Tightly Coupled Dipole Array (TCDA). This differential TCDA (D-TCDA) is developed for UHF-S band (viz. 0.4-3.4 GHz) operation with emphasis on dual-linear polarization and wide-angle scanning. Embodiments of the subject invention include a Balanced Wideband Impedance Transformer (BWIT) feed to eliminate common mode currents across the entire band while ensuring a minimal array thickness ($\lambda_{Low}/10$). The differential nature of the feed structure according to embodiments of the subject invention as well as the scalability of the TCDA arrays offer an easy pathway for a simple and low cost implementation at millimeter waves. Array simulations can be verified with measured results of an 8×8 prototype in a volume of 384 mm×384 mm×57 mm. The array achieves 8.5:1 bandwidth for VSWR <3 at broadside with scanning down to 45° from boresight in both E and H planes. The measured array gain can achieve a near-theoretical value across the whole operating band.

Embodiments of the subject invention show a TCDA with UWB differential feeding and scanning capability. FIGS. 1(a)-1(d) show a dual polarized differential TCDA (D-TCDA) array, a unit cell of the D-TCDA, and a differential feed structure of the unit cell according to an embodiment of the subject invention.

Referring to FIGS. 1(a)-1(d), the D-TCDA array (or differential array) 10 comprises a plurality of unit cells 20 that are arranged to form an egg-crate shape. Each of the plurality of unit cells 20 comprises a differential feed structure (or balanced wideband impedance transformer) 30. The balanced wideband impedance transformer 30 of the dual polarized array 10 comprises a first conductor layer 100, a second conductor layer 200 disposed on the first conductor layer 100, a third conductor layer 300 disposed on the second conductor layer 200, and a fourth conductor layer 400 disposed on the third conductor layer 300.

The first conductor layer 100 comprises a first metal line 110 and a second metal line 120. The first metal line 110 and the second metal line 120 are arranged to be symmetric to each other, and each of first metal line 110 and the second metal line 120 is a perforated strip line.

Similar to the first conductor layer 100, the fourth conductor layer 400 comprises a third metal line 410 and a fourth metal line 420. The third metal line 410 and the fourth metal line 420 are arranged to be symmetric to each other, and each of third metal line 410 and the fourth metal line 420 is a perforated strip line.

The second conductor layer 200 comprises a first feed line 210, and the third conductor layer 300 comprises a second feed line 310. A main part of the first feed line 210 is disposed between the first metal line 110 and the third metal line 410, and a main part of the second feed line 310 is disposed between the second metal line 120 and the fourth metal line 420. That is, the first feed line 210 and the second feed line 310 are not exactly overlapped with each other but arranged to have an opposite shape. Each of the first feed line 210 and the second feed line 310 has a tapered width.

The unit cell 20 of the dual polarized array 10 comprises dipole elements connected to the first feed line 210 and the second feed line 310 of the balanced wideband impedance transformer 30, and a plurality of FSS superstrates for low angle scanning. The dipole elements are located between the balanced wideband impedance transformer 30 and the FSS superstrates in a vertical direction.

Figure 2:
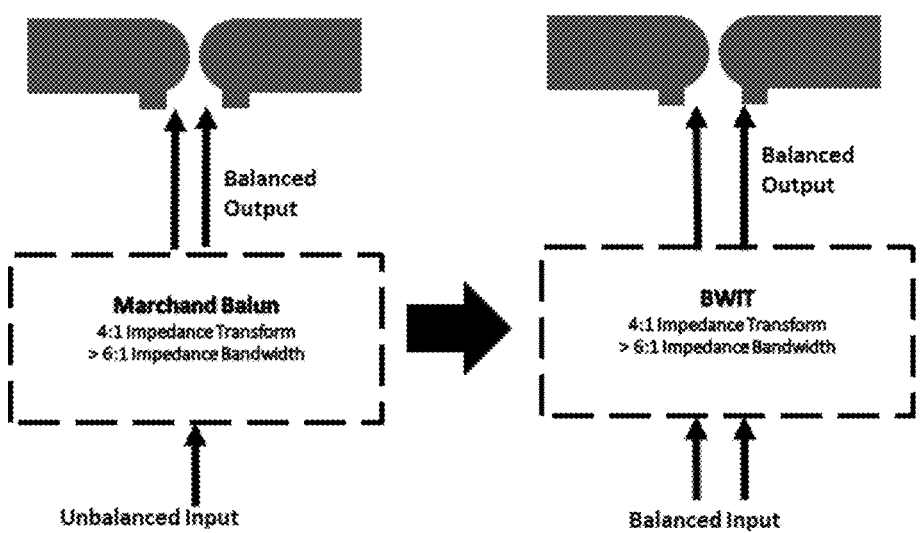
FIG. 2 shows attributes of a Marchand balun and differentially fed tightly coupled dipoles.

FIG. 2 shows attributes of a Marchand balun and differentially fed tightly coupled dipoles according to an embodiment of the subject invention. Referring to FIGS. 1(a)-1(d)

and 2, a dual polarized array 10 comprises the BWIT feed structure 30 receiving balanced input and providing balanced output. Thus, this differential array 10 has direct compatibility with existing wideband differential components. Mirroring the performance of previous integrated Marchand balun feeds, the differential design according to an embodiment of the subject invention uses physical symmetry to achieve an impressive cancellation of the common modes across >8:1 impedance bandwidth. Concurrently, scanning is achieved down to 45° from boresight in the principal E and H planes. Simulations are verified with measurements of a fabricated 8×8 prototype.

Figure 3:
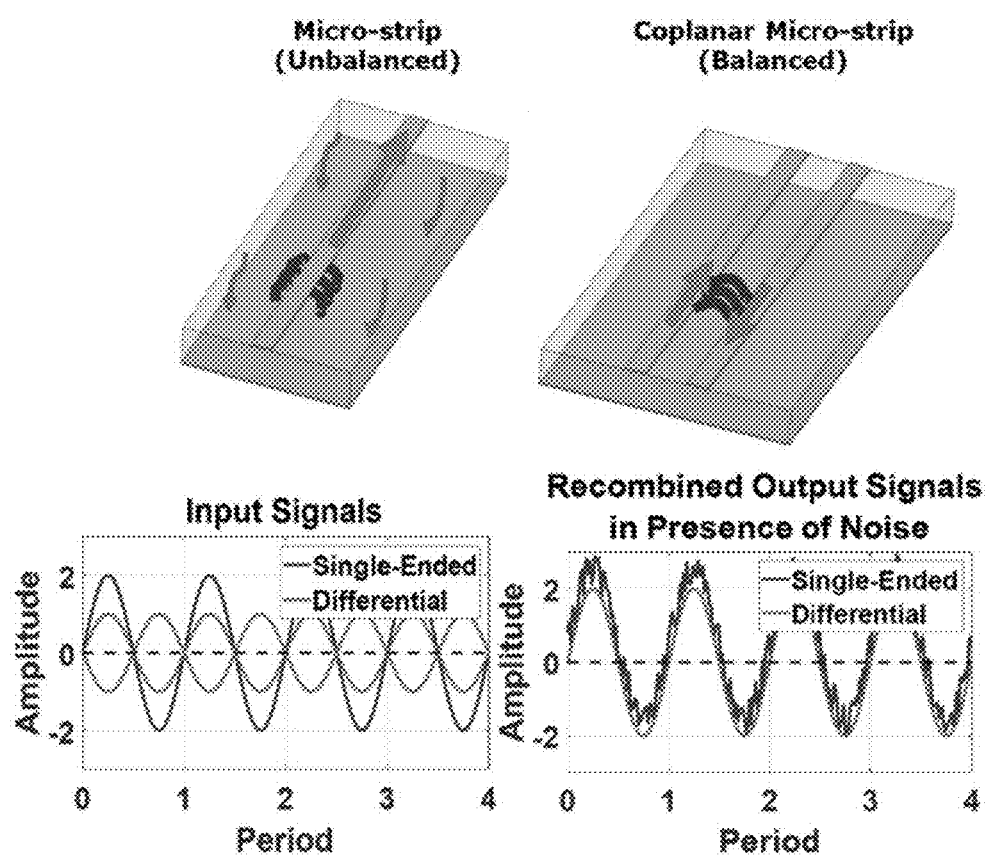
FIG. 3 shows time domain distortion effects on unbalanced and balanced excitations.

Embodiment of the subject invention present a differential (balanced) feed for tightly coupled dipoles, as depicted in FIG. 2, that overcomes the pitfalls of past differential antennas. These balanced feeds lower the noise in the transceiver chain and allow high dynamic range and linearity. Further, differential signals provide inherent lower distortion in response to noise and interference from power supplies. Differential signals are 180 degrees out of phase while having the same amplitude (e.g., can be represented by "+A" and "−A"). FIG. 3 shows time domain distortion effects on unbalanced and balanced excitations. Referring to FIG. 3, an unbalanced signal with unknown signal return path can be distorted by noise while a balanced/differential signal is resistant to noise. Even more, distortions due to even order harmonics from nonlinear devices can be suppressed by differential feeds. Embodiments of the subject invention exploit advancements in differential RF front-end components, such as push-pull amplifiers that provide significant increases in the operational bandwidths of balanced transceivers.

Figures 4A, 4B, 4C, 4D:
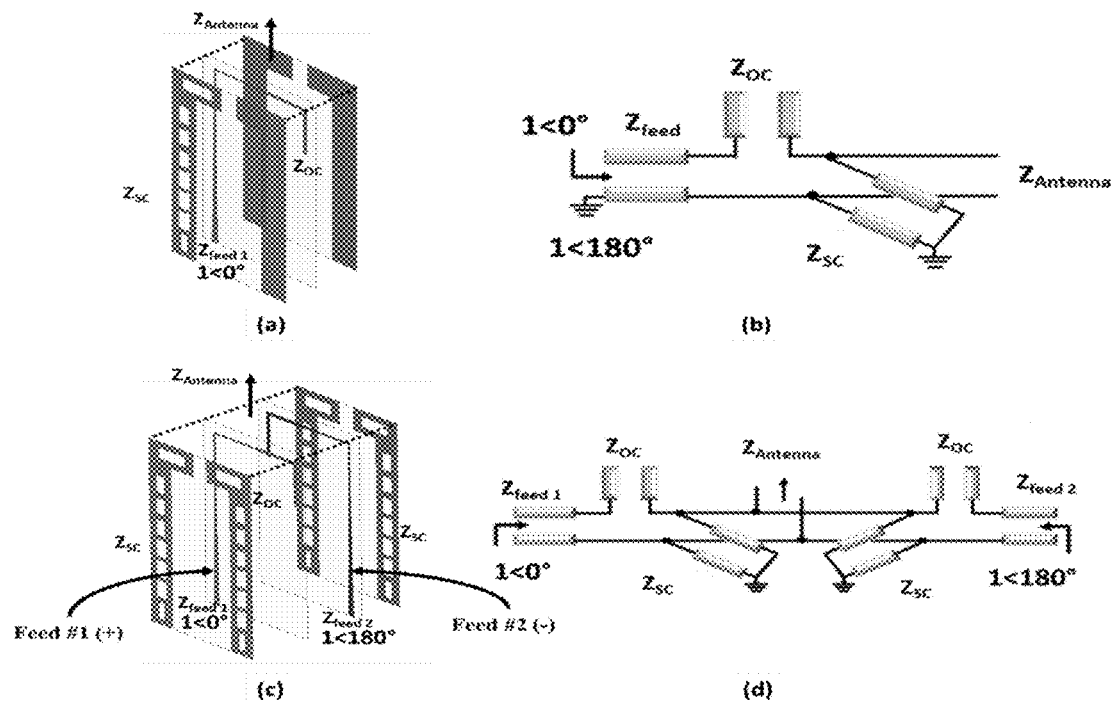
FIG. 4(a) shows a structure of a Marchand balun.
FIG. 4(b) shows a transmission line equivalent circuit of the Marchand balun.
FIG. 4(c) shows a differential feeding network according to an embodiment of the subject invention.
FIG. 4(d) shows a transmission line equivalent circuit of the differential feeding network according to an embodiment of the subject invention.

FIGS. 4(a) and 4(b) show a structure of a Marchand balun and a transmission line equivalent circuit of the Marchand balun. Referring to FIGS. 4(a) and 4(b), the balun employs a series open stub ($Z_{oc}$) and a parallel short stub ($Z_{sc}$). The length and characteristic impedance of these stubs are tuned to achieve wideband matching. As can be realized, a critical aspect of the balun suppression of common mode currents across large bandwidths.

FIGS. 4(c) and 4(d) show a differential feeding network (i.e., BWIT) according to an embodiment of the subject invention and a transmission line equivalent circuit of the differential feeding network. Referring to FIGS. 4(c) and 4(d), common mode currents are being eliminated through the BWIT feed network of FIG. 4(c), consisting of two Marchand baluns arranged in parallel, as represented by the circuit in FIG. 4(d). As such, symmetry between the feed lines is maintained for balanced transmission of opposite phase signals from the feed to the aperture over a wide bandwidth.

Figure 5:
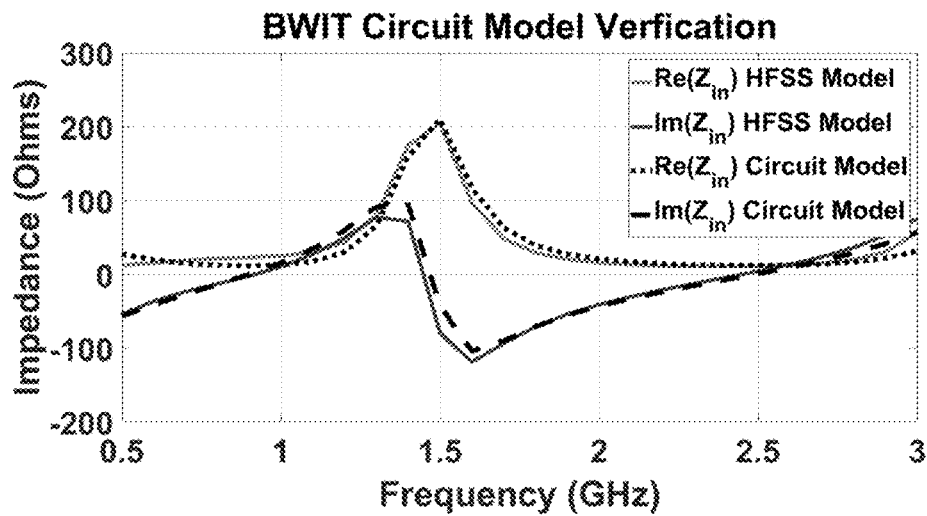
FIG. 5 shows verification of the BWIT equivalent circuit model.

FIG. 5 shows verification of the BWIT equivalent circuit model of FIGS. 4(c) and 4(d). With this equivalent circuit, the D-TCDA total equivalent circuit can be optimized quickly in circuit software, before conducting full-wave simulations.

Figure 6:
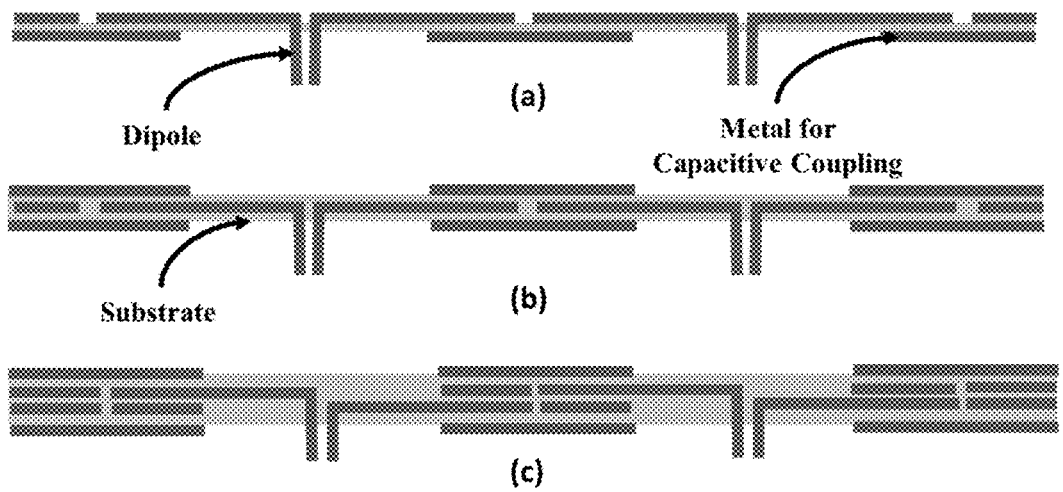
FIG. 6 shows various approaches to realize capacitive coupling in TCDAs and achieve wide bandwidths.

The design of the dual polarized array according to an embodiment of the subject invention employs two independent linear polarizations using an egg-crate configuration with a metal FSS superstrate for low-angle scanning. The polarizations are not fed concentrically, instead the feed cards intersect at the ends of the dipoles. FIG. 6 shows various approaches to realize capacitive coupling in TCDAs and achieve wide bandwidths. FIG. 6 (a) shows the layout of a traditional L band dual-polarized TCDA. For ease of fabrication on two layer boards, horizontal dipole arms of each linear polarization are employed. Referring to FIG. 6(a), capacitive coupling among the dipoles is realized using metal strips printed on the other side of the substrate. FIG. 6(b) shows an alternative method that uses three layer boards to create more capacitive coupling and improve bandwidth. However, the increased number of boards necessary for differential-feed symmetry extends the distance between the tightly coupled dipole arms, implying less capacitive coupling between dipoles and hence a smaller impedance bandwidth. To resolve this issue, a dual-offset approach to the dipole arms can be used. This topology is depicted in FIG. 6(c) and compensates for the larger capacitive gaps by offsetting the dipole arms and adding co-planar parasitic coupling layers. On doing so, embodiments of the subject invention show additional capacitive coupling to counter the inductive effects of the ground plane and improve the lower frequency performance of the array.

Figure 7:
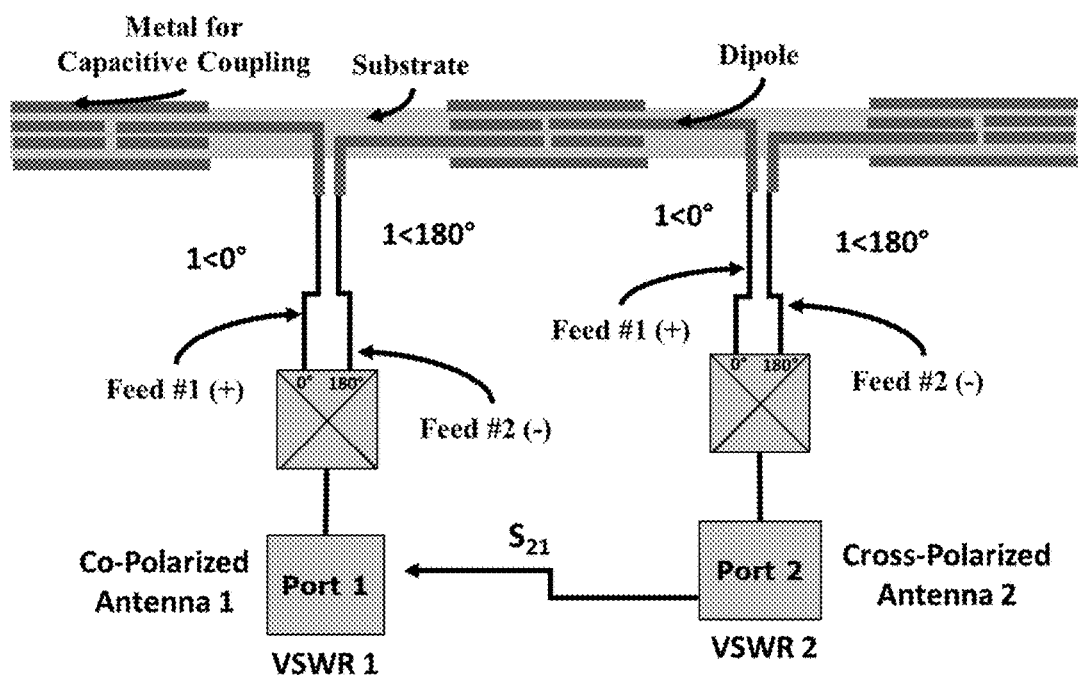
FIG. 7 shows the differential feed performance for each polarization as a single port network.
Figure 8:
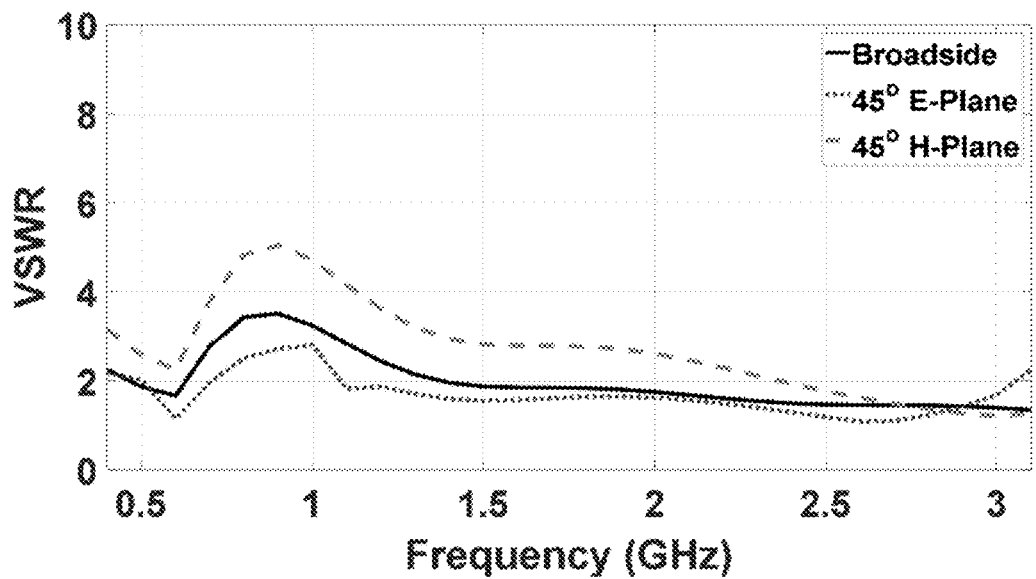
FIG. 8 shows simulated infinite array VSWR in the principle planes (E/H) of the array at broadside and scanning to 45°.
Figure 9:
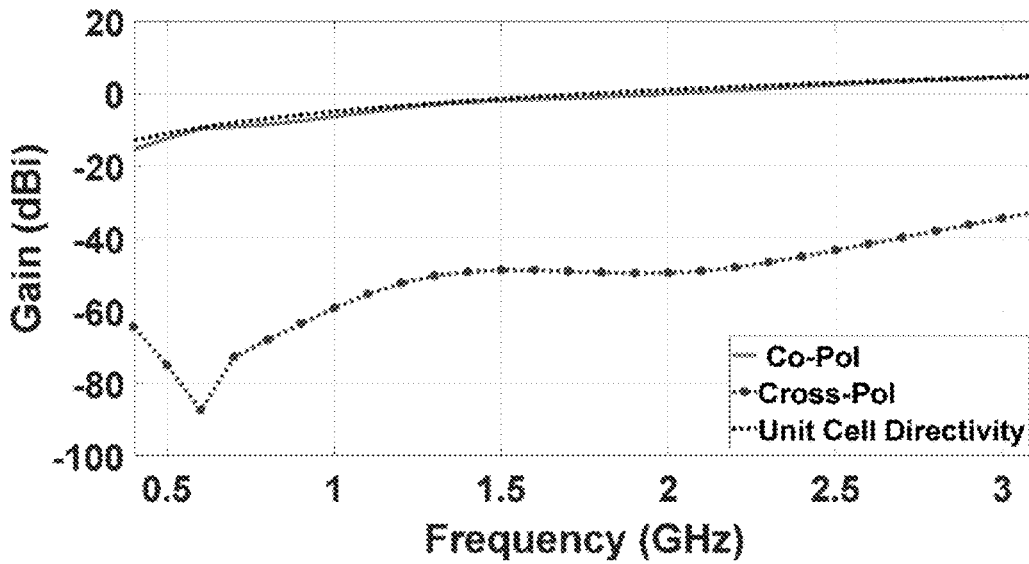
FIG. 9 shows realized gain of the D-TCDA infinite array unit cell with 40 dB of polarization purity.

FIG. 7 shows the differential feed performance for each polarization as a single port network. For simplicity, an infinite array simulation can be used to represent the 8×8 finite element array using ANSYS HFSS v.19. As depicted in FIG. 7, the simulations can be performed using a pair of differential 50Ω lumped ports, with respective phases of 0° and 180°. Post-processing can be used to represent the differential feed performance of each polarization as a single port network. FIG. 8 shows the infinite array VSWR in the principle planes, with scanning to 45°. Referring to FIG. 8, the array provides a VSWR <3 across 0.4-3.2 GHz, implying an impedance bandwidth of 8:1. A diagonal plane (D-plane) scanning VSWR plot is not included since it appears as an average of the best and worst cases of the E-plane and H-plane cuts. FIG. 9 shows full wave gain predictions. Referring to FIG. 9, a near theoretical gain is achieved with 40 dB average polarization diversity.

Figure 10:
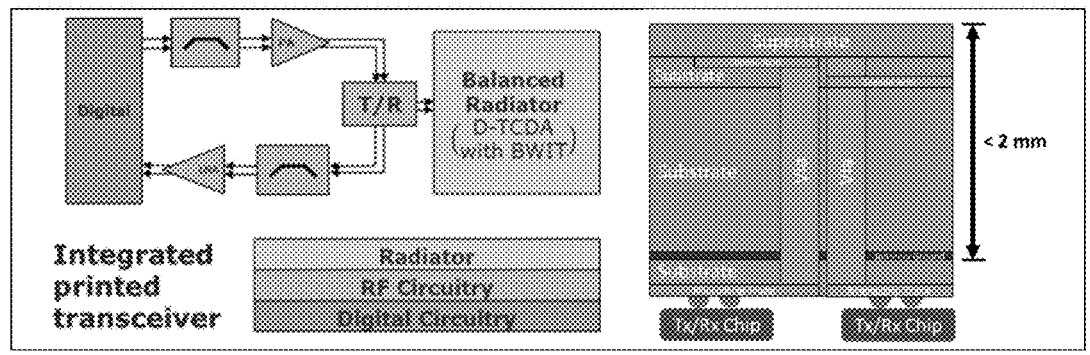
FIG. 10 shows a System in Package (SiP) approach using a millimeter wave D-TCDA (left) with example PCB stackup (right).

FIG. 10 shows a System in Package (SiP) approach using a millimeter wave D-TCDA (left) with example PCB stackup (right). The draw for integrated printed receivers, such as that in FIG. 10, lies primarily in higher frequency bands, where condensed multifunctional radios are of great interest. The presented differentially fed TCDA has been shown to operate at frequencies exceeding 18 GHz. Looking ahead to 5G operations in the 24 GHz, 28 GHz, 37-40 GHz, and 64-71 GHz bands, significant path/space-loss at these frequencies will require high gain phased array antennas with polarization diversity, wide scanning volumes, and inexpensive fabrication. These are all attributes of current TCDAs.

Much research is being developed for System on Chip (SiC) transceivers, where cost and material losses are high and yields can be as low as 10%. An alternate approach is a layer-by-layer Printed Circuit Board (PCB) solution to directly integrate the differential antenna with other modules onto a core signal distribution panel. This follows a SiP approach that modularly incorporates the low-cost PCB array plane with RF front-end circuitry (for instance, flip-chip SiGe die) and digital modules with low cost solder-bump/Ball Grid Array (BGA) technology. The most obvious advantages are the compactness and modularity of the design, and the high yield associated with the well-known low cost PCB processes. Further, this hybrid packaging approach allows co-integration of custom and commercial off-the-shelf (COTS) components using standard fabrication processes, reducing system complexity.

Figure 11:
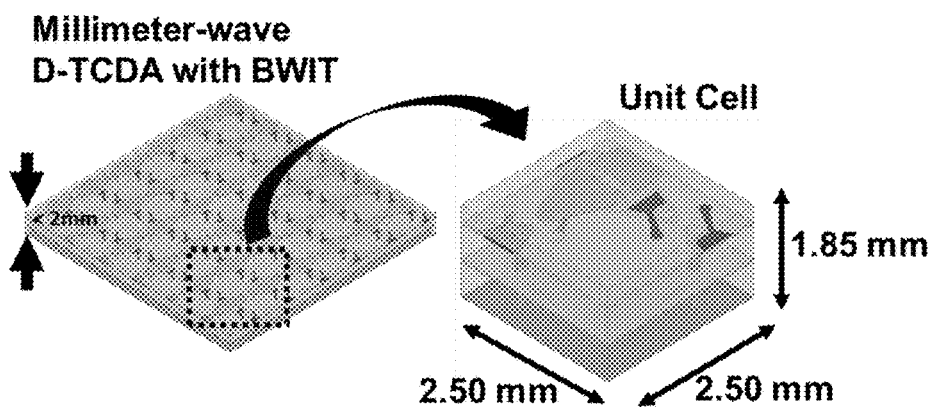
FIG. 11 shows Millimeter-wave D-TCDA with BWIT feed network.

FIG. 11 shows Millimeter wave D-TCDA with BWIT feed network. A dual-polarized mm-wave implementation of the BWIT fed TCDA of FIG. 11 would create a >4:1 for full access to the complete 5G spectrum. The low profile of the TCDA, in conjunction with the short wavelengths associated with higher frequencies allow for a complete radiator profile of less than 2 mm. These systems are well-suited for both mass-produced and specialized mobile platforms.

Figure 12:
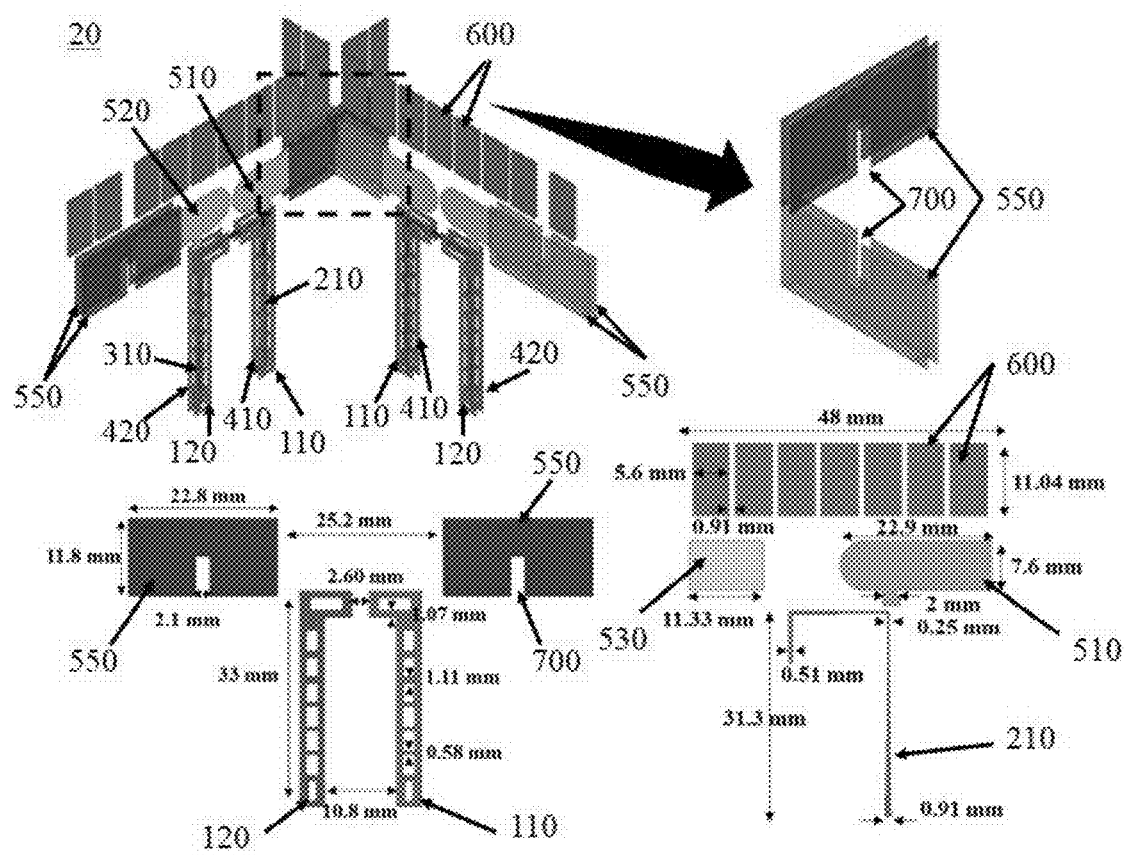
FIG. 12 shows unit cell details of the fabricated dual polarized D-TCDA according to an embodiment of the subject invention. The mirrored metal layers are printed on 20 mil substrate layers with relative dialectic constant of εr=2.2.

FIG. 12 shows unit cell details of the fabricated dual polarized D-TCDA according to an embodiment of the subject invention. The antenna board is constructed from three layers of 20 mil Rogers 5880 ($\varepsilon_r$=2.2) with metal layers following those in FIG. 12. The minimum metal tolerance was 0.25 mm (10 mil) in accordance with standard low-cost PCB processes.

FIG. 12 shows two unit cells 20 and each unit cell 20 comprises the BWIT including the first metal line 110, the second metal line 120, the third metal line 410, the fourth metal line 420, the first feed line 210 disposed between the first metal line 110 and the third metal line 420, and the second feed line 310 disposed between the second metal line 120 and the fourth metal line 420. A width of the first feed line 210 changes to have a tapered strip line, and the first to fourth metal lines are perforated strip lines.

The unit cell 20 further comprises a first dipole 510 connected to the first feed line 210, a second dipole 520 connected to the second feed line 310, and a plurality of coupling metals 550 disposed on both sides of the first 510 and second 520 dipoles such that a surface of the coupling metal faces a surface of the dipole. Each of the plurality of coupling metals 550 includes a notch 700 such that the coupling metals are coupled with each other through the notches 700. Notches 700 can be cut into the dielectric boards of the dual-polarized array to enable an "egg-crate" arrangement with consideration towards structural stability.

The unit cell 20 comprises a plurality of FSS superstrates 600 and can include a support plate 530 corresponding to the first dipole 510. For the fabricated design of the FSS superstrates 600, an FSS metal superstrate can be printed on the vertical antenna cards for optimized scanning performance.

Figure 13:
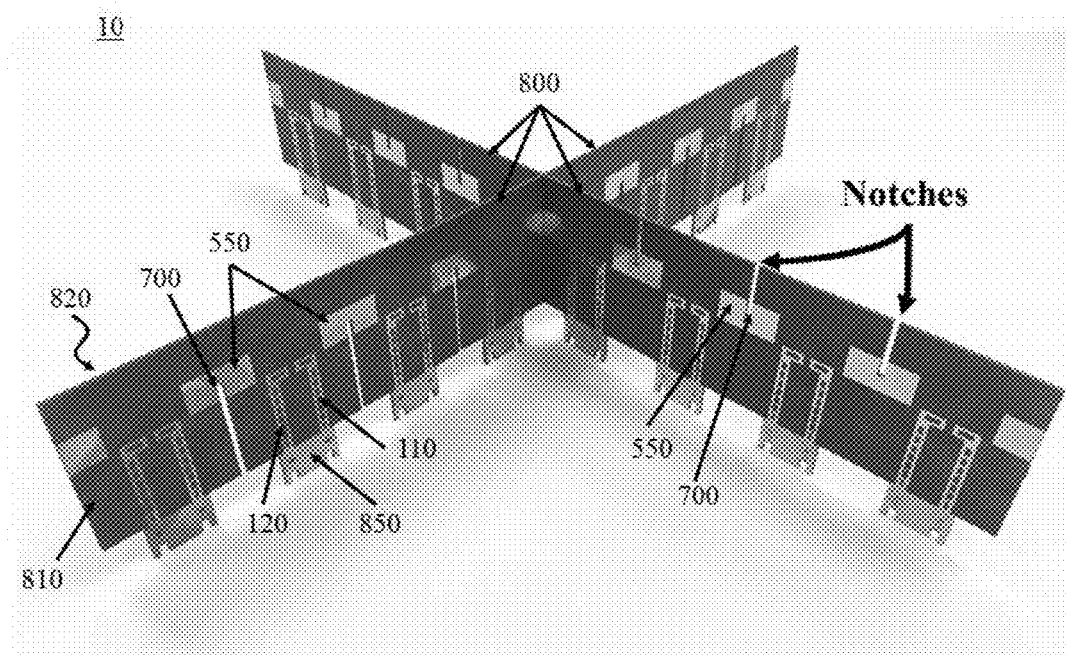
FIG. 13 shows fabricated array cards for E/H polarizations placed to form the egg crate arrangement according to an embodiment of the subject invention.

FIG. 13 shows fabricated array cards for E/H polarizations placed to form the egg crate arrangement according to an embodiment of the subject invention. Referring to FIGS. 12 and 13, no direct electrical connection or soldering is required at the joints, therefore avoiding the pitfall. Referring to FIGS. 12 and 13, the dual polarized array 10 comprises a substrate 800 including a first surface 810 and a second surface 820 opposite to the first surface 810, wherein the first metal line 110 and the second metal line 120 are disposed on the first surface 810, and the third metal line 410 and the fourth metal line 420 are disposed on the second surface 820. The substrate 800 further comprises a substrate notch that is connected to the notch 700 of the coupling metal 550. In addition, the first metal line 110 and the second metal line 120 are connected to each other through a common plate 850.

Figure 14:
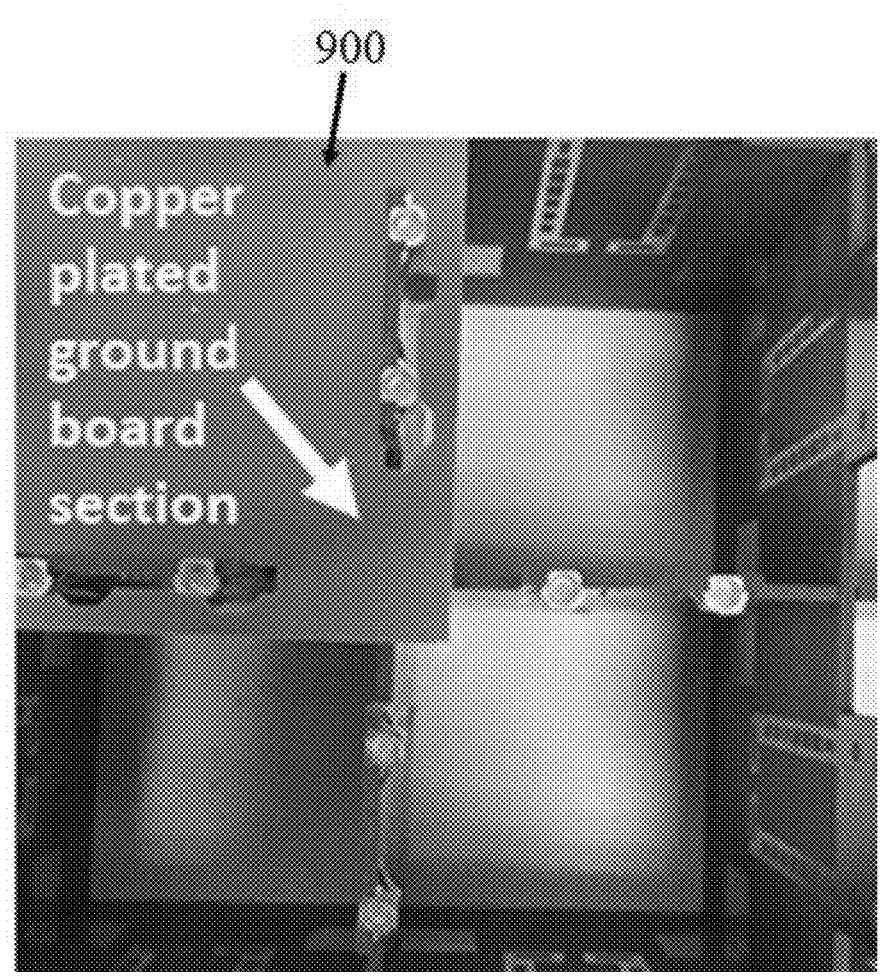
FIG. 14 shows a ground plane section with resonance-free slots for securing the antenna cards according to an embodiment of the subject invention.

FIG. 14 shows a ground plane section with resonance-free slots for securing the antenna cards according to an embodiment of the subject invention. Referring to FIG. 14, a ground plane 900 can be formed by being milled from a metalized 60 mil FR4 board with cutouts for securing the antenna cards. A total of four ground plane sections can be joined together with copper tape to form a large, lightweight, structurally stable and resonance free ground plane for testing the array.

Figure 15:
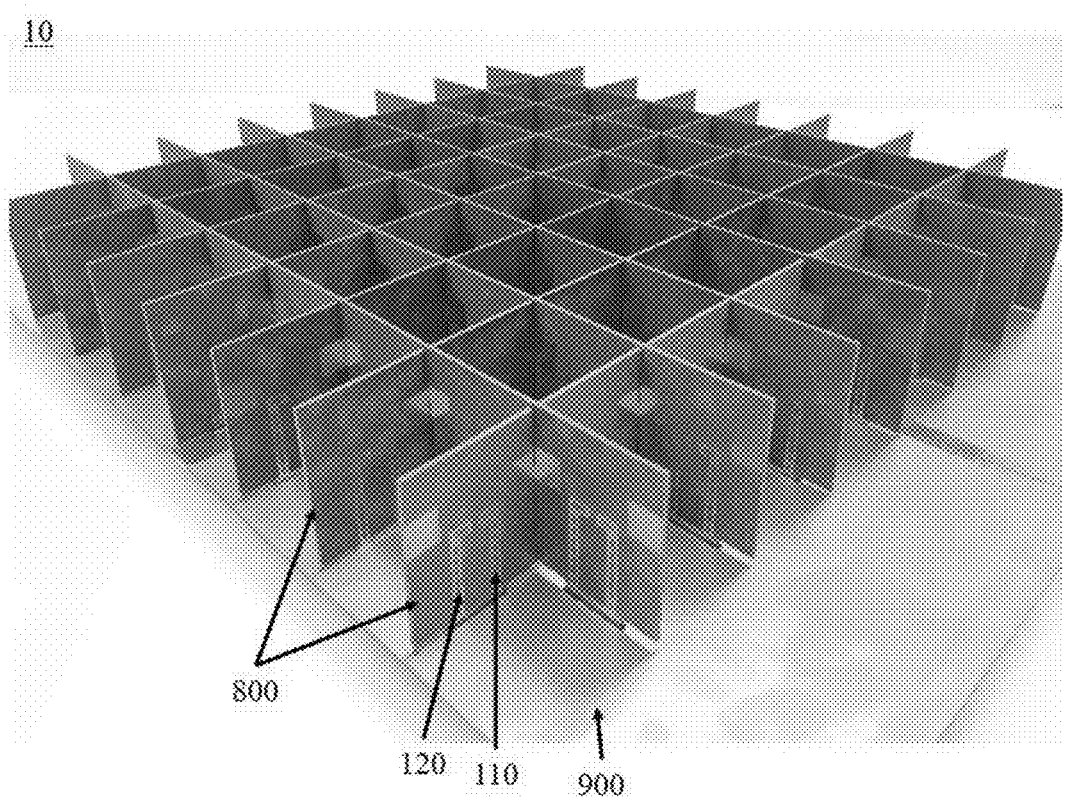
FIG. 15 shows a fabricated 8×8 array in an egg-crate configuration prior to measurement according to an embodiment of the subject invention.
Figure 16:
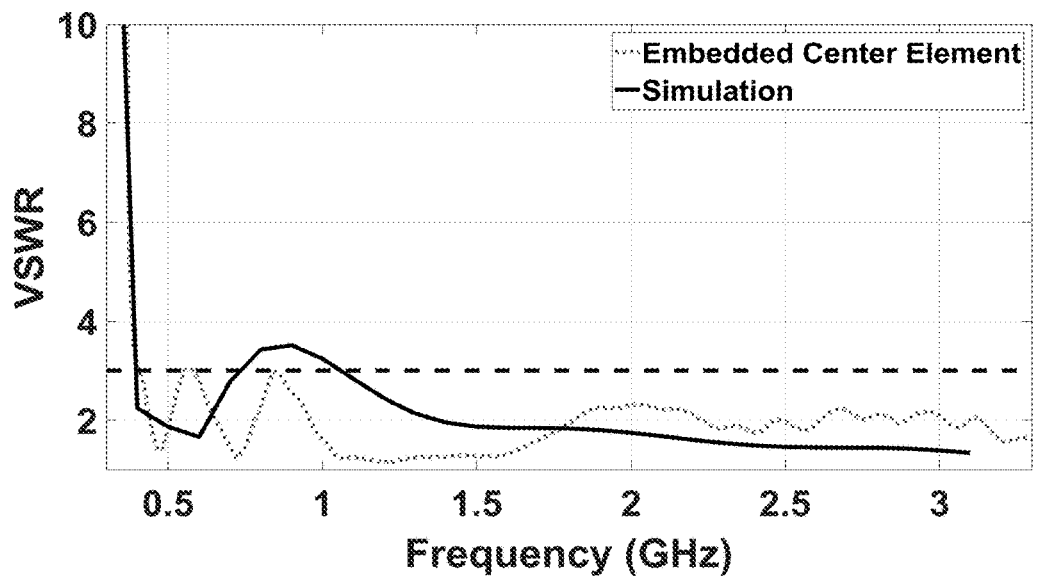
FIG. 16 shows a measured VSWR and a simulation of a center element as a function of frequency.
Figure 17:
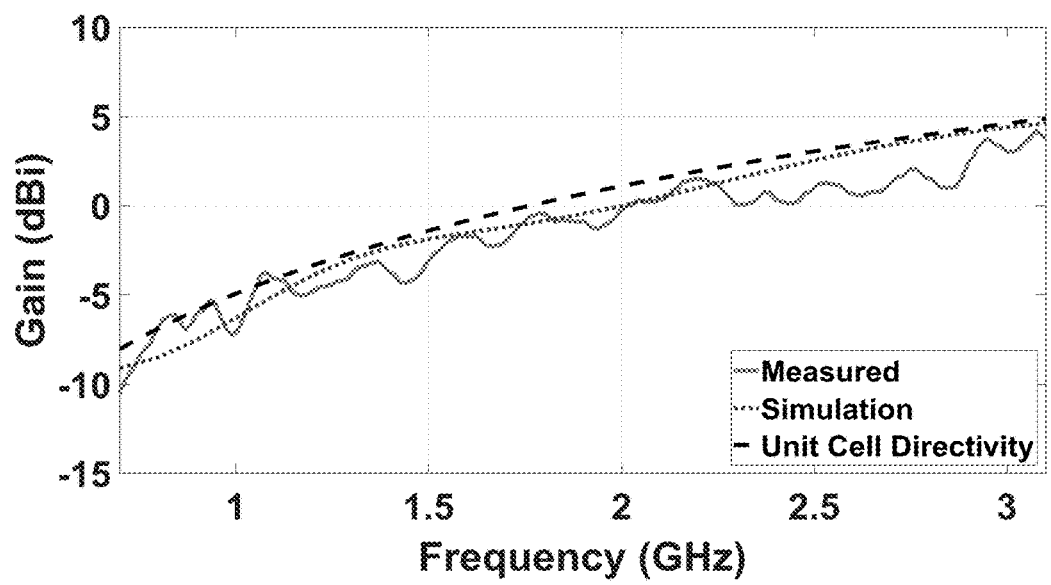
FIG. 17 shows a measured broadside gain and a simulation of a center element as a function of frequency.

FIG. 15 shows a fabricated 8×8 array in an egg-crate configuration prior to measurement according to an embodiment of the subject invention. FIG. 16 shows a measured VSWR and a simulation of center element as a function of frequency, and FIG. 17 shows a measured broadside gain and a simulation of a center element as a function of frequency. Referring to FIGS. 15-17, the measured VSWR yields an 8.5:1 impedance bandwidth with VSWR <3 from 0.4 to 3.4 GHz at broadside. Gain measurements are only shown for frequencies greater than 700 MHz due to the low frequency cutoff of the reference horn. Likewise, the measured cross-polarized gain is limited by the cross-polarization properties of the reference horn.

Figure 18:
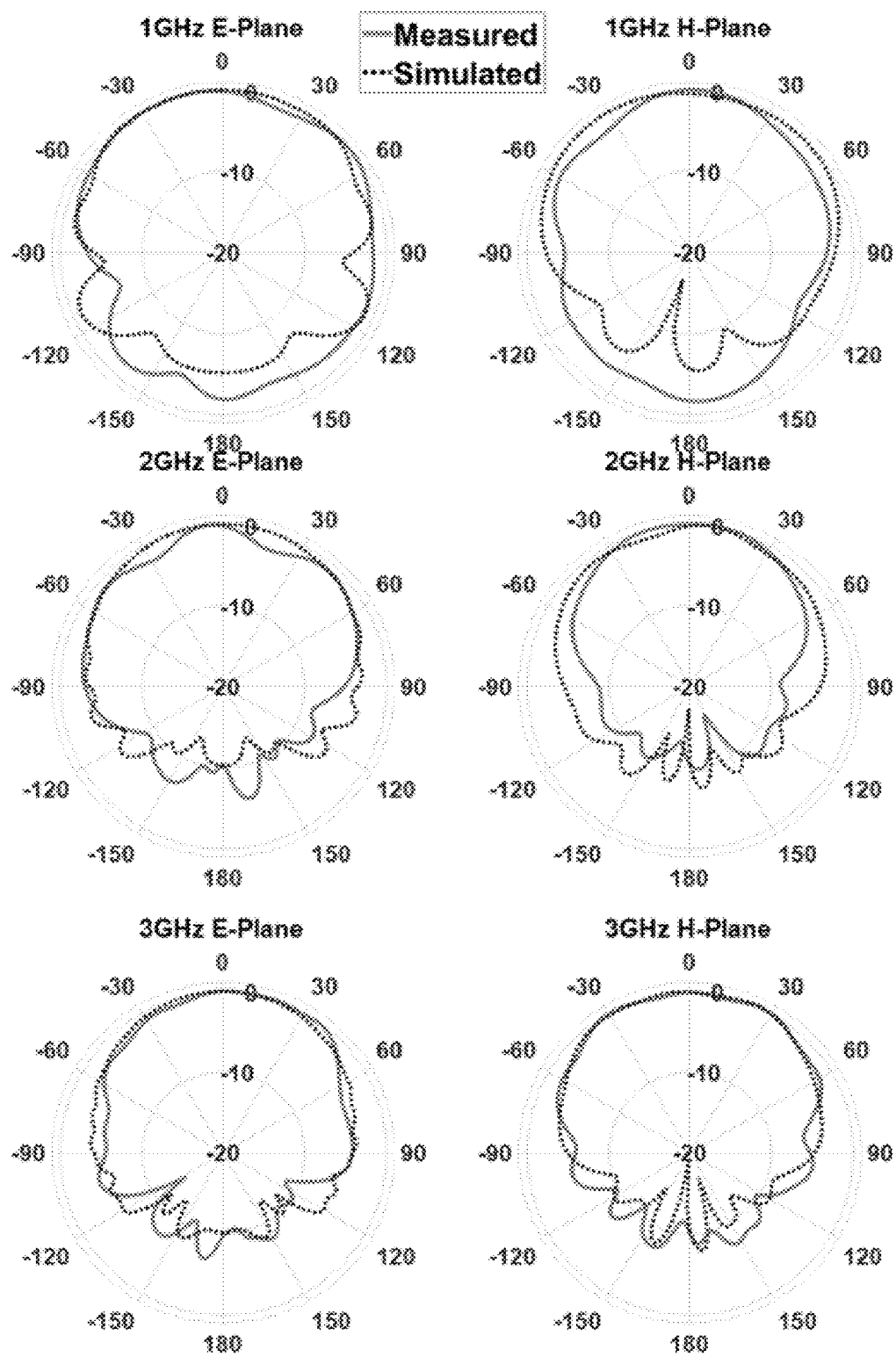
FIG. 18 shows measured gain patterns and simulations at 1 GHz, 2 GHz, and 3 GHz in the E/H planes.

FIG. 18 shows measured gain patterns and simulations at 1 GHz, 2 GHz, and 3 GHz in the E/H planes. Referring to FIG. 18, the measured gain patterns for a single center element are shown and are well correlated with the simulations. These patterns can be used to generate patterns of the 8×8 array at different scan angles.

Embodiments of the subject invention provide a novel dual-polarized differentially fed array operating across the UHF to S bands (viz. 0.4-3.4 GHz). The equivalent circuit of the wideband differential feed can be used to optimize the antenna performance. Design considerations for differential symmetry and methods for increasing bandwidth allow the array to achieve scanning down to 45° with VSWR <3, showing good agreement with simulations. Embodiments of the subject invention are frequency scalable and well-suited to future integration into common differential printed modules at mm-waves. It eschews the need for connectors and cabling, greatly reducing the total weight and cost of the transceiver. By employing high speed ADCs and multi-band RF front ends, high spectral efficiency can be achieved with current technologies.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A balanced wideband impedance transformer, comprising:
   a first conductor layer including a first metal line and a second metal line;
   a second conductor layer including a first feed line and disposed on the first conductor layer;
   a third conductor layer including a second feed line and disposed on the second conductor layer; and
   a fourth conductor layer including a third metal line and a fourth metal line, and disposed on the third conductor layer.

2. The balanced wideband impedance transformer according to claim 1, each of the first to fourth metal lines being a perforated strip line.

3. The balanced wideband impedance transformer according to claim 1, the first feed line being disposed between the first metal line and the third metal line, and the second feed line being disposed between the second metal line and the fourth metal line.

4. The balanced wideband impedance transformer according to claim 1, the first feed line and the second feed line being configured to be respectively connected to a first phase signal and a second phase signal that is 180 degrees out of phase with the first phase signal, the first phase signal and the second phase signal having the same amplitude as each other.

5. The balanced wideband impedance transformer according to claim 1, the first metal line being symmetric to the second metal line, and the third metal line being symmetric to the fourth metal line.

6. The balanced wideband impedance transformer according to claim 1, each of the first feed line and the second feed line being configured to have a tapered width.

7. A unit cell of a dual polarized array, comprising:
the balanced wideband impedance transformer according to claim 1;
a first dipole connected to the first feed line; and
a second dipole connected to the second feed line.

8. The unit cell according to claim 7, further comprising:
a substrate in which the first dipole and the second dipole are disposed;
a plurality of coupling metals disposed on a surface of the substrate; and
a plurality of frequency selective surface (FSS) superstrates disposed in the substrate.

9. A dual polarized array, comprising:
a plurality of unit cells, the plurality of unit cell including the unit cell according to claim 8; and
a ground plane connected to the first to fourth metal lines of each of the plurality of unit cells.

10. The dual polarized array according to claim 9, the plurality of unit cells being arranged to form an egg-crate shape.

11. A balanced wideband impedance transformer, comprising:
a first perforated metal line and a second perforated metal line that are disposed at a first plane;
a third perforated metal line and a fourth perforated metal line that are disposed at a second plane;
a first feed line disposed between the first perforated metal line and the third perforated metal line; and
a second feed line disposed between the second perforated metal line and the fourth perforated metal line.

12. The balanced wideband impedance transformer according to claim 11, further comprising a first dipole connected to the first feed line and a second dipole connected to the second feed line.

13. The balanced wideband impedance transformer according to claim 12, further comprising a plurality of coupling metals corresponding to the first dipole and the second dipole.

14. The balanced wideband impedance transformer according to claim 13, further comprising a substrate, the first feed line, the second feed line, the first dipole, and the second dipole being located inside the substrate.

15. The balanced wideband impedance transformer according to claim 14, further comprising a plurality of frequency selective surface (FSS) superstrates disposed inside the substrate.

16. The balanced wideband impedance transformer according to claim 15, further comprising a ground plane connected to the first to fourth perforated metal lines.

17. The balanced wideband impedance transformer according to claim 16, each of the first feed line and the second feed line being a tapered strip line.

18. The balanced wideband impedance transformer according to claim 17, the first feed line and the second feed line being configured to be respectively connected to a first phase signal and a second phase signal that is 180 degrees out of phase with the first phase signal, the first phase signal and the second phase signal having the same amplitude as each other.

19. The balanced wideband impedance transformer according to claim 18, further comprising a common plate connected to the first perforated metal line and the second perforated metal line.

20. A balanced wideband impedance transformer, comprising:
a substrate;
a first metal line and a second metal line that are disposed on a first surface of the substrate;
a third metal line and a fourth metal line that are disposed on a second surface of the substrate;
a first feed line disposed between the first metal line and the third metal line and disposed inside the substrate;
a second feed line disposed between the second metal line and the fourth metal line and disposed inside the substrate;
a first dipole connected to the first feed line and disposed inside the substrate;
a second dipole connected to the second feed line and disposed inside the substrate;
a plurality of frequency selective surface (FSS) superstrates disposed inside the substrate; and
a ground plane connected to the first to fourth metal lines,
the first dipole being placed between the first feed line and the FSS superstrates.

* * * * *